(12) United States Patent
Kim

(10) Patent No.: US 6,878,966 B2
(45) Date of Patent: *Apr. 12, 2005

(54) THIN-FILM TRANSISTOR DISPLAY DEVICES

(75) Inventor: Dong-gyu Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/406,668

(22) Filed: Apr. 3, 2003

(65) Prior Publication Data

US 2003/0201436 A1 Oct. 30, 2003

Related U.S. Application Data

(62) Division of application No. 10/092,282, filed on Mar. 6, 2002, now Pat. No. 6,566,686, which is a continuation of application No. 09/770,576, filed on Jan. 26, 2001, now Pat. No. 6,383,831, which is a continuation of application No. 08/808,886, filed on Feb. 28, 1997, now Pat. No. 6,087,678.

(30) Foreign Application Priority Data

Feb. 29, 1996 (KR) .............................................. 96-5307

(51) Int. Cl.[7] .............................................. H01L 29/04
(52) U.S. Cl. ........................ 257/59; 257/72; 257/347; 257/348; 257/349; 257/350; 257/351; 257/352
(58) Field of Search ............................ 257/59, 347–350

(56) References Cited

U.S. PATENT DOCUMENTS

| 5,153,690 A | 10/1992 | Tsukada et al. ............... 257/61 |
| 5,177,577 A | 1/1993 | Taniguchi et al. ............. 257/59 |
| 5,585,647 A | 12/1996 | Nakajima et al. ............... 257/72 |
| 5,731,856 A | 3/1998 | Kim et al. ..................... 349/43 |
| 5,808,706 A | 9/1998 | Bae .............................. 349/54 |
| 6,087,678 A | 7/2000 | Kim ............................. 257/59 |
| 6,566,686 B2 * | 5/2003 | Kim ............................. 257/59 |
| 6,593,990 B1 * | 7/2003 | Yamazaki ..................... 349/138 |

* cited by examiner

Primary Examiner—Fetsum Abraham
(74) Attorney, Agent, or Firm—Myers Bigel Sibley & Sajovec

(57) ABSTRACT

Thin-film transistor display devices include composite electrodes which provide low resistance contacts and paths for electrical signals and are less susceptible to parasitic metal migration which can limit display quality and lifetime. In particular, a thin-film transistor (TFT) display device is provided having an insulated gate electrode on a face of a substrate (e.g., transparent substrate) and a semiconductor layer on the insulated gate electrode, opposite the face of the substrate. Spaced apart source and drain electrodes are also provided on the semiconductor layer. These source and drain electrodes each preferably comprise a composite of at least two layers containing respective metals therein of different element type. Preferably, one of the layers comprises a metal which is capable of forming a low resistance contact with electrodes such as a pixel electrode (e.g., transparent indium-tin-oxide electrode) and the other of the layers comprises a relatively low resistance metal so that the overall effective resistance of each composite electrode is maintained at a low level.

10 Claims, 7 Drawing Sheets

THIN-FILM TRANSISTOR DISPLAY DEVICES

REFERENCE TO PRIOR-FILED APPLICATIONS

This application is a divisional of U.S. application Ser. No. 10/092,282, filed Mar. 6, 2002, now U.S. Pat. No. 6,566,686, which is a continuation of U.S. application Ser. No. 09/770,576, filed Jan. 26, 2001, now U.S. Pat. No. 6,383,831, which is a divisional of U.S. application Ser. No. 08/808,886, filed Feb. 28, 1997, now U.S. Pat. No. 6,087,678, the disclosures of which are hereby incorporated herein by reference.

FIELD OF THE INVENTION

The present invention relates to display devices and methods of fabrication, and more particularly to liquid crystal display devices and methods of fabricating liquid crystal display devices.

BACKGROUND OF THE INVENTION

In order to minimize the space required by display devices, research into the development of various flat panel display devices such as LCD display devices, plasma display panels (PDP) and electro-luminescence displays (EL), has been undertaken to displace larger cathode-ray tube displays (CRT) as the most commonly used display devices. Particularly, in the case of LCD display devices, liquid crystal technology has been explored because the optical characteristics of liquid crystal material can be controlled in response to changes in electric fields applied thereto.

At present, the dominant methods for fabricating liquid crystal display devices (LCD) and panels are methods based on amorphous silicon (a-Si) thin film transistor (TFT) technologies. Using these technologies, high quality image displays of substantial size can be fabricated using low temperature processes. As will be understood by those skilled in the art, conventional LCD devices typically include a transparent (e.g., glass) substrate with an array of thin film transistors thereon, pixel electrodes, orthogonal gate and data lines, a color filter substrate and liquid crystal material between the transparent substrate and color filter substrate. The use of a-Si TFT technology typically also requires the use of separate peripheral integrated circuitry to drive the gates and sources (i.e., data inputs) of the TFTs in the array. Therefore, there is typically provided a large number of pads for connecting the gate lines (which are coupled to the gates of the TFTs) and data lines (which are coupled to the sources of the TFTs) to the peripheral drive circuitry.

FIG. 1 is a diagram illustrating a schematic layout of a conventional LCD display device. Here, plurality of gate lines 3 and plurality of data lines 7 are arranged in a substrate 1 in a matrix format. A plurality of gate pads 5 and a plurality of data pads 9 are also provided at ends of the gate lines 5 and the data lines 7, respectively. A portion of the device enclosed by one gate line 3 and one data line 7 typically forms a pixel 11. In addition, FIG. 2 is a flowchart illustrating five steps of a conventional method of forming a TFT-LCD display device, and FIGS. 3–5 are sectional views illustrating a TFT-LCD manufactured by the conventional method of FIG. 2.

A conventional method for manufacturing a TFT-LCD display device will now be described with reference to FIGS. 2–5. First, a first metal layer, having a stacked structure including chromium (Cr) and an aluminum (Al) alloy, is formed on a transparent glass substrate 100 to a predetermined thickness. Then, the first metal layer is etched by a first photolithography process to form a gate electrode 10 and a gate line 10' on a TFT portion and gate pad portion of the substrate 100 (step 101). Then, a layer (e.g., nitride layer) is deposited on the entire surface of the substrate having the gate electrode 10 and the gate line 10' thereon to form a gate insulation layer 12. An amorphous silicon layer and an impurity-doped amorphous silicon layer are then sequentially deposited on the gate insulation layer 12 to form an amorphous semiconductor layer. Next, the amorphous semiconductor layer is patterned by a second photolithography process, resulting in a semiconductor layer pattern 14 on the TFT portion of the substrate 100 (step 102).

Then, a second metal layer such as Cr is deposited on the entire surface of the insulation layer 12 and on the amorphous semiconductor layer pattern 14 to a predetermined thickness. The second metal layer is then patterned by a third photolithography process to form a data line 16a and a source/drain electrode 16b on the TFT portion of the substrate, a gate pad 16c on the gate pad portion of the substrate, and a data pad 16d on a data pad portion of the substrate (step 103), as illustrated by FIGS. 3–5, respectively.

A passivation layer 18 is then formed on the entire surface of the above structure to a predetermined thickness. The passivation layer 18 is then patterned to expose parts of the drain electrode 16b, the gate line 10' and data pad 16d using a fourth photolithography process (step 104). After forming an indium-tin-oxide (ITO) layer as a transparent conductive layer on the entire surface of the structure having the passivation layer pattern 18 thereon, the ITO layer is patterned by a fifth photolithography process to form a pixel electrode 20 (step 105).

Unfortunately, the use of chromium (Cr) as the second metal layer may not be preferred as a data line material because it typically has a relatively high resistivity. This relatively high resistivity can lead to an increased RC delay associated with the data line and can reduce the maximum viewing angle of the display. The use of chromium as the second metal layer may also be limited by the frequency of formation of metal line discontinuities during processing which can reduce device yield. Also, the use of aluminum (Al) or an alloy thereof may not be preferred because contact formation between aluminum based alloys and indium-tin-oxide (ITO) layers typically results in the formation of aluminum oxide clusters. These oxide clusters typically act as electrical insulators and increase contact resistance. As will be understood by those skilled in the art, these insulating clusters are typically formed when current passes through the aluminum/ITO contacts and causes aluminum atoms to migrate into the ITO. This parasitic phenomenon is typically referred to as "metal migration".

Thus, notwithstanding the above described method of forming TFT-LCD devices, there continues to be a need for improved methods of forming TFT-LCD display devices.

SUMMARY OF THE INVENTION

It is therefore an object of the present invention to provide improved thin-film transistor display devices and methods of forming same.

It is another object of the present invention to provide thin-film transistor display devices which are less susceptible to parasitic metal migration, and methods of forming same.

It is still another object of the present invention to provide thin-film transistor display devices having improved electrode and display characteristics, and methods of forming same.

These and other objects, features and advantages of the present invention are provided by thin-film transistor display devices having improved composite electrodes which provide, among other things, low resistance contacts and paths for electrical signals and are less susceptible to parasitic metal migration which can limit display quality and lifetime, and methods of forming same. In particular, a thin-film transistor (TFT) display device is provided having an insulated gate electrode on a face of a substrate (e.g., transparent substrate) and a semiconductor layer on the insulated gate electrode, opposite the face of the substrate. Spaced apart source and drain electrodes are also provided on the semiconductor layer. These source and drain electrodes each preferably comprise a composite of at least two layers containing respective metals therein of different element type. Preferably, one of the layers comprises a metal which is capable of forming a low resistance contact with electrodes such as a pixel electrode (e.g., transparent indium-tin-oxide electrode) and the other of the layers comprises a relatively low resistance metal so that the overall effective resistance of each composite electrode is maintained at a low level.

According to one preferred embodiment of the present invention, an insulated gate electrode is provided which contains a composite gate electrode on a face of a substrate and a gate insulating layer on the composite gate electrode. Here, the composite gate electrode preferably comprises a first gate layer containing a refractory metal such as chromium (Cr), molybdenum (Mo), titanium (Ti) and tantalum (Ta), and a second gate layer containing aluminum on the first gate layer. A semiconductor layer comprising a composite of two amorphous silicon (a-Si) layers is also provided on the gate insulating layer, opposite the face of the substrate. Here, the composite semiconductor layer preferably comprises an undoped first amorphous silicon layer having a thickness of about 2000 Å and a second doped (e.g., N-type) amorphous silicon layer having a thickness of about 500 Å on the first amorphous silicon layer. Spaced apart source and drain electrodes are also provided on the composite semiconductor layer, in ohmic contact with second amorphous silicon layer. These spaced apart source and drain electrodes define a channel region in the semiconductor layer which extends opposite the insulated gate electrode. Here, the source and drain electrodes each comprise a first metal layer containing a refractory metal and a second metal layer containing aluminum. The second metal layer preferably has a lower resistivity than the first metal layer to provide a low overall electrode resistance, however, the first metal layer preferably allows for the formation of low resistance ohmic contacts thereto which are less susceptible to metal migration and oxide cluster formation. Such contacts include an ohmic contact between the drain electrode and an indium-tin-oxide pixel electrode.

According to another embodiment of the present invention, a method of forming a thin-film transistor display device is provided which comprises the steps of forming an insulated gate electrode on a face of a substrate and then forming a semiconductor layer on the insulated gate electrode, opposite the face. Spaced apart composite source and drain electrodes are then formed on the semiconductor layer. These source and drain electrodes preferably each comprise a composite of at least two layers containing respective metals therein of different element type. In particular, one of the layers is provided so that each composite electrode has low overall resistance and the other of the layers is provided so that low resistance ohmic contacts can be formed thereto. According to this preferred embodiment, a pixel electrode (e.g., indium-tin-oxide) is also formed in ohmic contact with the one of the layers in the composite drain electrode. Here, for example, the drain electrode is formed as a composite of a patterned first metal layer comprising a refractory metal and a patterned second metal layer thereon containing aluminum. The pixel electrode is then preferably formed by removing a portion of the patterned second metal layer to expose the patterned first metal layer and then depositing indium-tin-oxide onto the exposed first metal layer. In addition, to provide low overall resistance, the second metal layer is formed having a thickness of about 2000 Å and the first metal layer is formed having a thickness of about 1000 Å so that the resistivity of the composite of the first and second metal layers is dominated by the resistivity of the second metal layer which is typically lower than the resistivity of the first metal layer.

DESCRIPTION OF PREFERRED EMBODIMENTS

Figure 1:
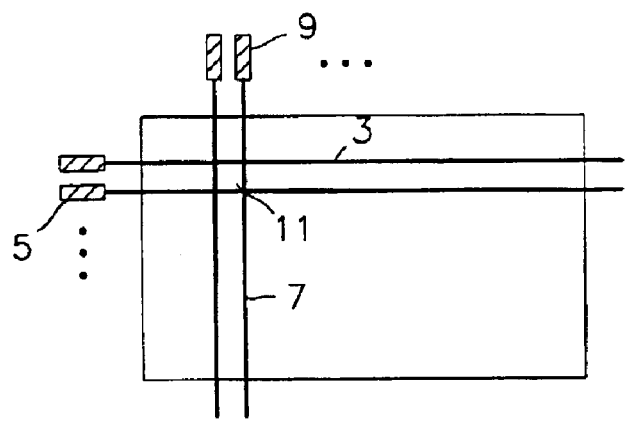
FIG. 1 is a schematic diagram illustrating the general layout of a conventional liquid crystal display device.
Figure 2:
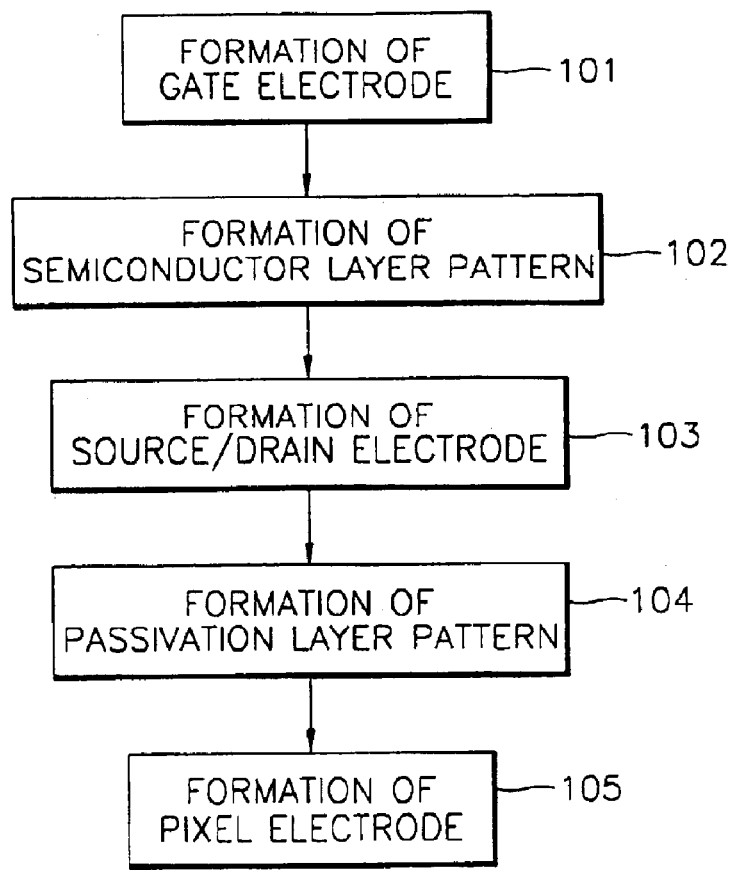
FIG. 2 is a flowchart of steps illustrating a method of forming a thin-film transistor (TFT) liquid crystal display (LCD) device according to the prior art.
Figure 3:
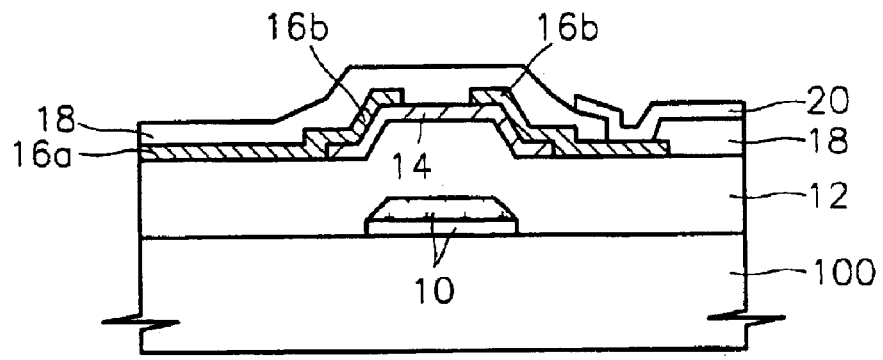
FIGS. 3–5 illustrate schematic cross-sectional views of intermediate structures illustrating a method of forming a thin-film transistor display device according to the method of FIG. 2.
Figure 4:
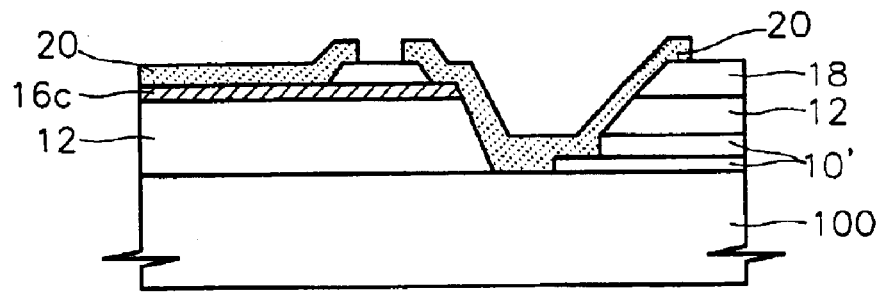
Figure 5:
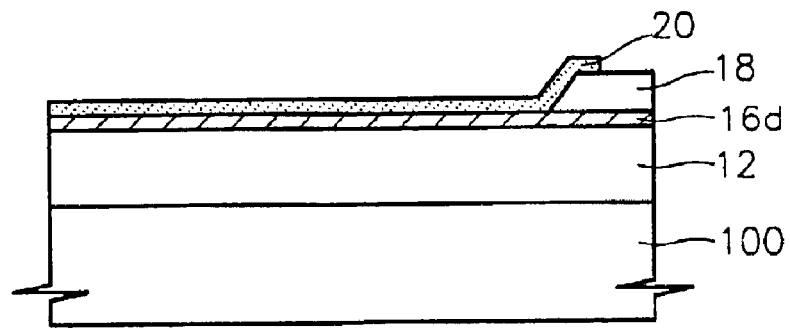

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 6:
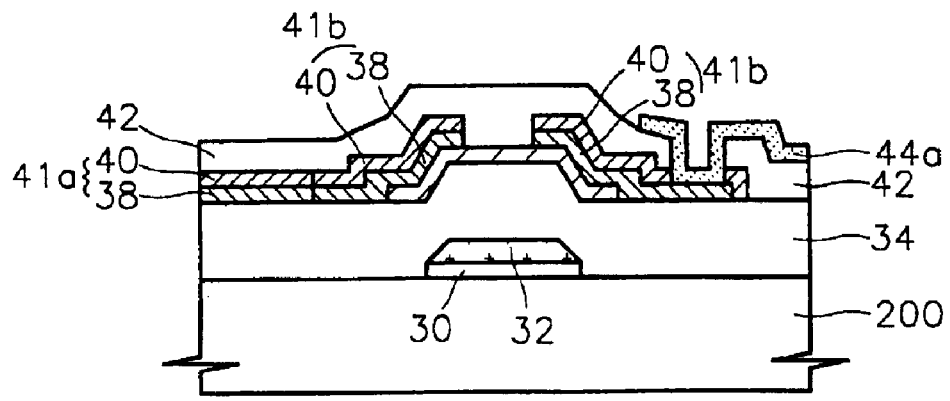
FIGS. 6–8 illustrate schematic cross-sectional views of a thin-film transistor display device according to a first embodiment of the present invention.
Figure 7:
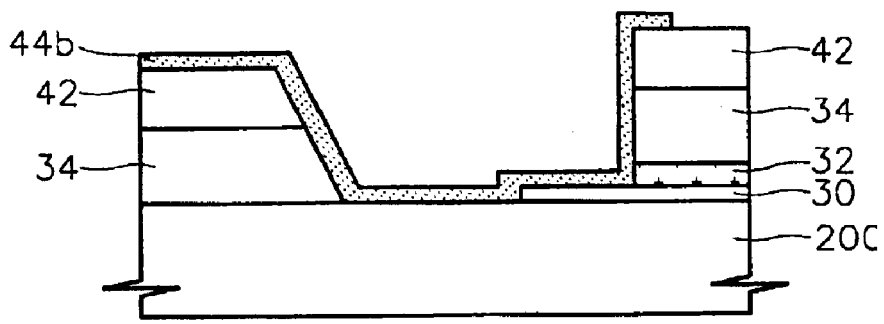
Figure 8:
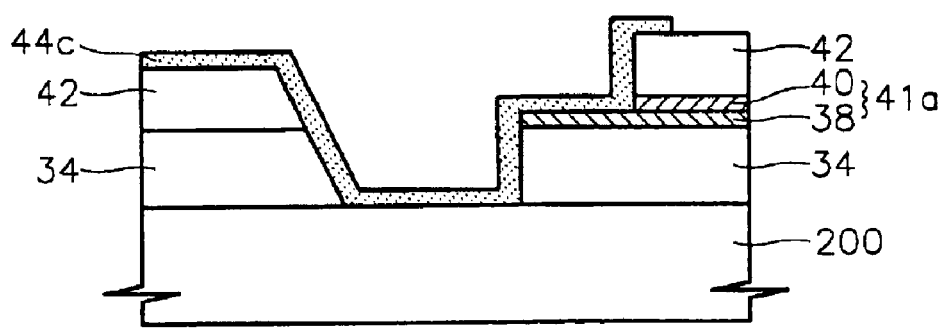

Referring now to FIGS. 6–8, a thin-film transistor display device according to a first embodiment of the present invention will now be described. Here, FIGS. 6–8 illustrate cross-sectional views of portions of an integrated thin-film transistor display device, including a thin-film transistor portion, a gate pad portion and a data pad portion, respectively. In particular, FIG. 6 illustrates a cross-sectional view of a thin-film transistor display device comprising an insulated gate electrode on a face of a transparent semiconductor substrate 200 (e.g., glass). The insulated gate electrode may comprise a composite gate electrode on the face of the substrate 200 and a surrounding gate insulating layer 34 which may comprise an oxide or silicon nitride. The composite gate electrode preferably comprises a first gate layer 30 and a second gate layer 32. The first gate layer 30 may comprise a refractory metal such as chromium (Cr), molybdenum (Mo), titanium (Ti) and tantalum (Ta) and the second gate layer 32 may comprise an aluminum alloy such as an aluminum-neodymium alloy (Al—Nd). Alternatively, the second gate layer 32 may be formed on the face of the substrate 200 and the first gate layer 30 may be formed on an upper surface of the second gate layer 32. In addition, a patterned semiconductor layer 36 is provided on an upper surface of the gate insulating layer 34. The patterned semiconductor layer 36 preferably comprises amorphous silicon (a-Si) and more preferably comprises a composite of a undoped first amorphous silicon layer and a doped (e.g., N-type) second amorphous silicon layer on the first amorphous silicon layer. Here, the second amorphous silicon layer is provided so that low resistance contacts (e.g., source and drain contacts) can be made to the patterned semiconductor layer 36.

Spaced apart source and drain electrodes 41b are also provided on the patterned semiconductor layer 36. Preferably, each of the source and drain electrodes 41 b comprises a composite of at least two layers 38 and 40. As illustrated by FIGS. 6 and 8, a data line 41a (which is connected to the source electrode 41b) is also provided as a composite of the two layers 38 and 40. In particular, the first metal layer 38 preferably comprises a refractory metal selected from the group consisting of chromium (Cr), molybdenum (Mo), titanium (Ti) and tantalum (Ta) and the second metal layer 40 preferably comprises an aluminum alloy such as an aluminum-neodymium alloy (Al—Nd). According to this embodiment, the first metal layer 38 is capable of forming a low resistance contact with electrodes such as a pixel electrode 44a (e.g., transparent indium-tin-oxide electrode) and the second metal layer 40 preferably comprises a relatively low resistance metal so that the overall effective resistance of each composite source and drain electrode (and data line, etc.) is maintained at a low level. The first metal layer 38 also preferably comprises a metal which is less susceptible to metal migration when a current is passed therethrough.

As illustrated by FIGS. 6–8, a patterned passivation layer 42 is also provided and a pixel electrode 44a, gate pad 44b and data pad 44c are provided in contact holes in the passivation layer 42. Preferably, the pixel electrode 44a, gate pad 44b and data pad 44c form ohmic contacts with the first metal layer 38 in the drain electrode, the first gate layer 30 in the gate electrode and the first metal layer 38 in the data line 41a, respectively. The pixel electrode 44a, gate pad 44b and data pad 44c may comprise indium-tin-oxide (ITO). Alternatively, the ordering of the first and second metal layers 38 and 40 may be reversed so that the first metal layer 38 is formed on an upper surface of the second metal layer 40.

Figure 11:
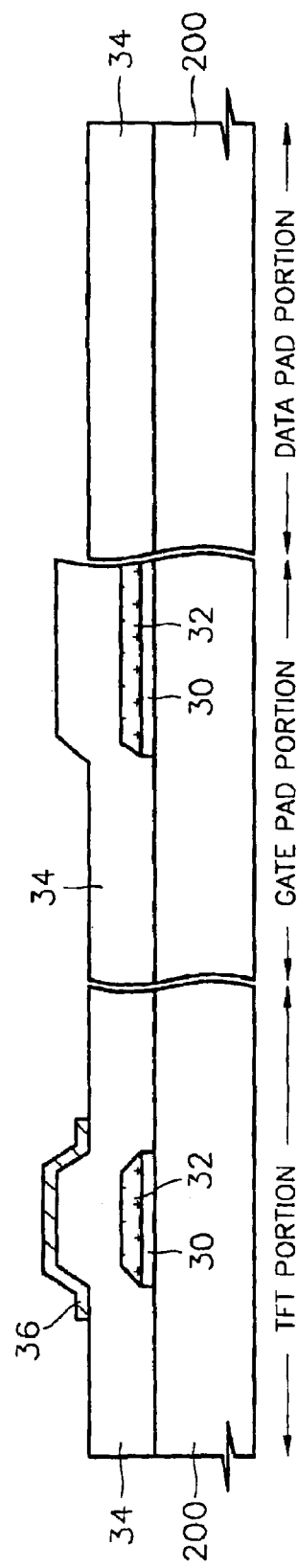

Referring now to FIGS. 9–14, preferred methods of forming thin-film display devices according to the present invention will now be described. According to one embodiment of the present invention, a method of forming a thin-film display device comprises the steps of forming an insulated gate electrode (and gate line) on a face of a transparent substrate 200 (e.g., glass). As illustrated best by FIG. 10 and step 201 in FIG. 9, these steps include the steps of depositing a layer 30 of a refractory metal such as chromium, molybdenum, titanium and tantalum on the face of the substrate 200 and then depositing a layer 32 of an aluminum alloy such as Al—Nd on the refractory metal layer. Preferably, the refractory metal layer may be deposited to have a thickness of about 1000 Å and the aluminum alloy layer may be deposited to have a thickness of about 2000 Å. These metal layers are then patterned using conventional techniques to form a gate electrode on a TFT portion of the substrate and a gate line on a gate pad portion of the substrate, as illustrated. As illustrated best by FIG. 11, an insulating layer 34 having a thickness of about 3000 Å is then deposited on the substrate 200. The insulating layer 34 may comprise an oxide, silicon nitride or silicon oxynitride, for example. Referring still to FIG. 11 and step 202 in FIG. 9, a patterned semiconductor layer 36 is then formed on the insulating layer 34, opposite the gate electrode. The patterned semiconductor layer 36 preferably comprises a composite of a first undoped amorphous silicon (a-Si) layer having a thickness of about 2000 Å and a second doped (e.g., N-type) amorphous silicon layer having a thickness of about 500 Å, on the first amorphous silicon layer. The doped second amorphous silicon layer is preferably provided so that highly conductive ohmic contacts can be easily formed with subsequently patterned source and drain electrodes, as described below.

Figure 12:
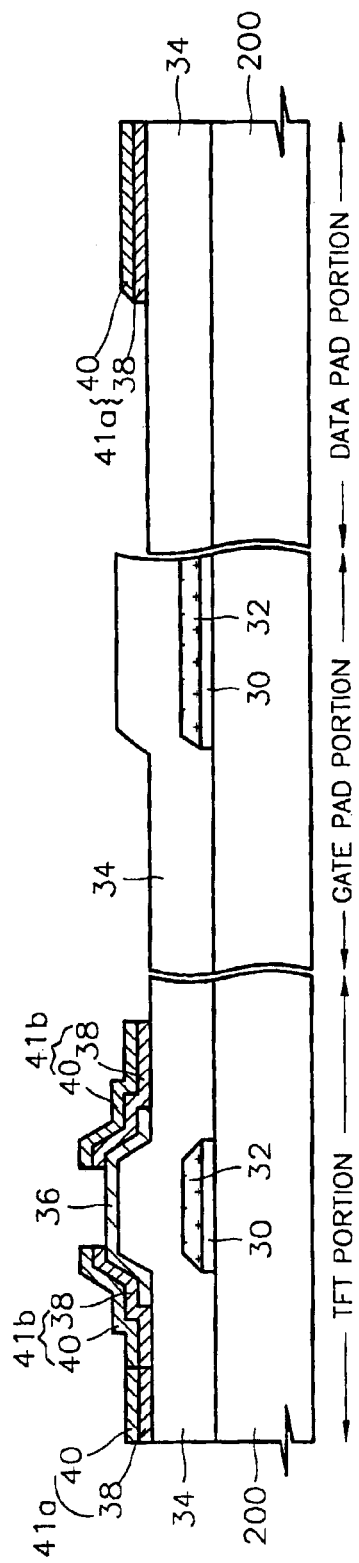

Referring to FIG. 12 and step 203 of FIG. 9, the steps of forming composite source and drain electrodes 41b and a composite data line 41a will now be described. In particular, a first metal layer 38 having a thickness of about 1000 Å is deposited on the insulating layer 34 and patterned semiconductor layer 36 and then a second metal layer 40 is deposited on the first metal layer 38. These metal layers are then patterned using conventional techniques to form composite source and drain electrodes 41b and a data line 41a and expose an upper portion of the patterned semiconductor layer 36, as illustrated. The first metal layer 38 is preferably deposited as a refractory metal layer so that low resistance contacts can be formed thereto and the second metal layer 40 is preferably formed as an aluminum alloy layer having low resistivity so that the drain and source electrodes and data line have low overall resistance (and lower RC delay associated therewith).

Figure 9:
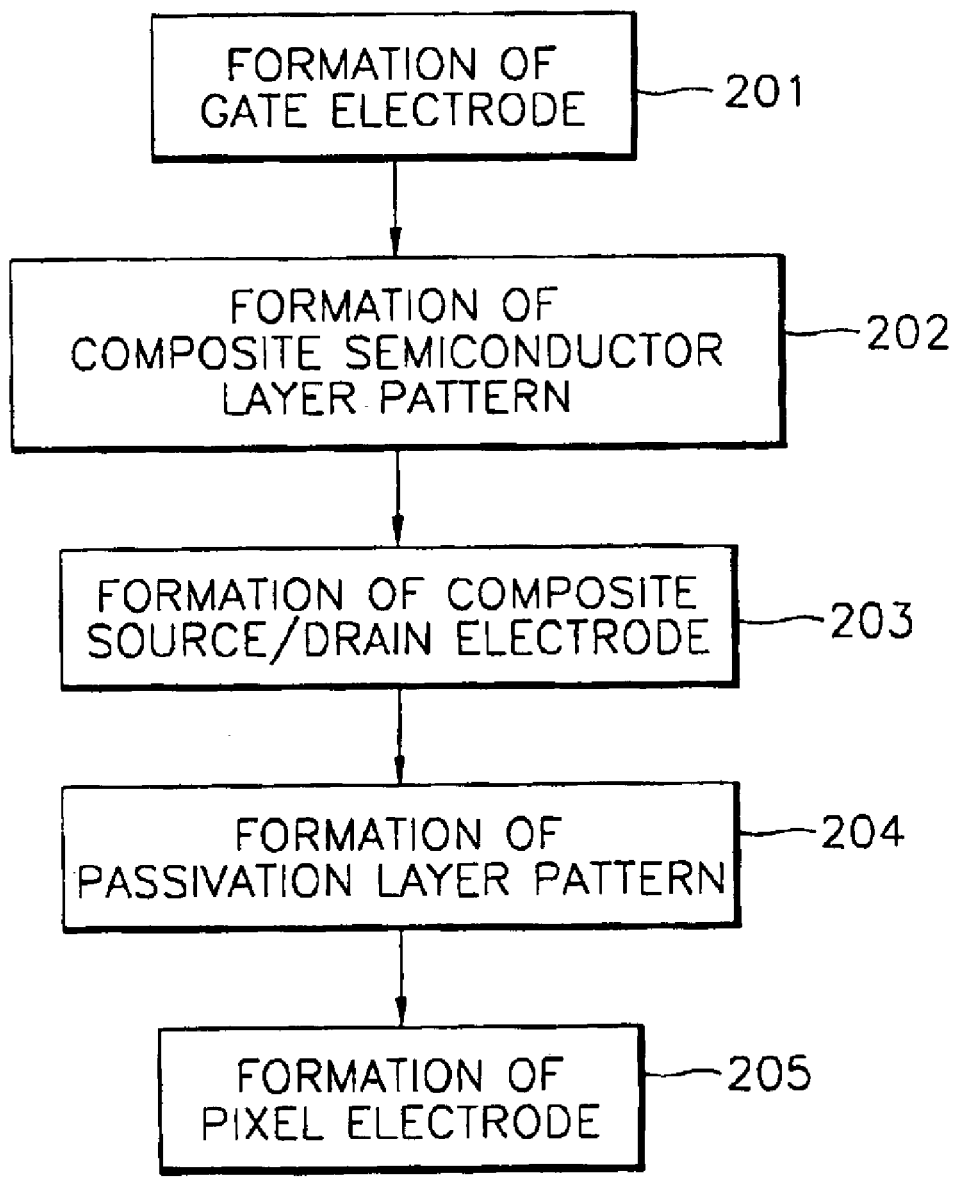
FIG. 9 is a flowchart of steps illustrating a method of forming a thin-film transistor (TFT) liquid crystal display (LCD) device according to the present invention.
Figure 10:
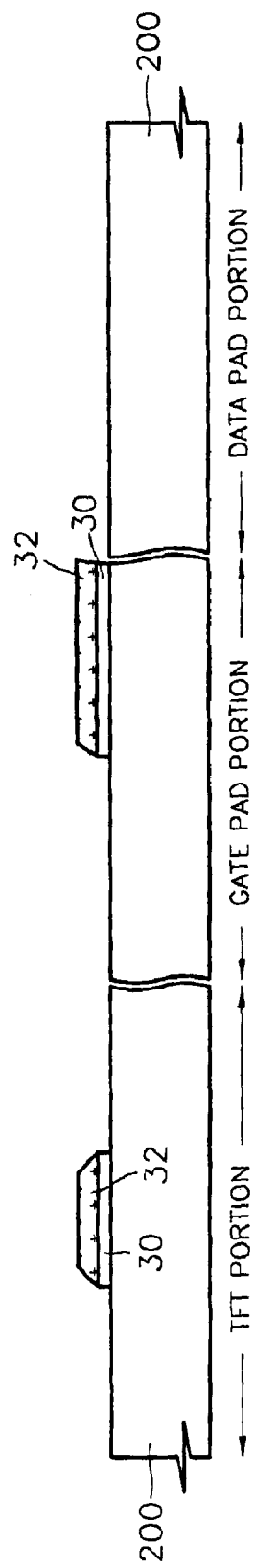
FIGS. 10–14 illustrate schematic cross-sectional views of intermediate structures illustrating a method of forming a thin-film transistor display device according to the method of FIG. 9.
Figure 13:
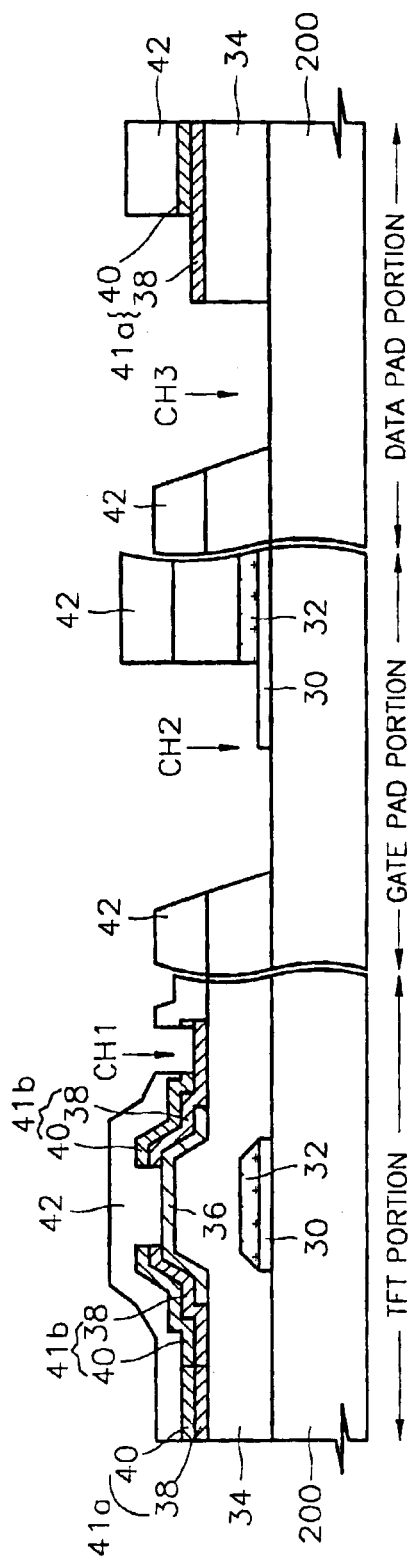

Referring now to FIG. 13 and step 204 of FIG. 9, a passivation layer 42 (e.g., nitride) having a thickness in a range between about 2000–4000 Å is then deposited and then patterned to define first, second and third contact holes (CH1–CH3) which expose end portions of the drain electrode 41b, gate line and data line 41a, respectively. Here, the patterned second metal layer 40 and the patterned second gate layer 32 are also wet etched to expose portions of the patterned first metal layer 38 and patterned first gate layer 30 (i.e., expose the refractory metal portions of the drain electrode, gate line and data line). Thus, those portions of the drain electrode, gate line and data line which are susceptible to contact deterioration caused by metal migration, are removed to expose refractory metal portions which are capable for forming high quality and reliable ohmic contacts which are less susceptible to oxide cluster formation. Alternatively, in the event the refractory metal layers 30 and 38 are formed on upper surfaces of the aluminum alloy layers 32 and 40, then this wet etching step can be eliminated.

Figure 14:
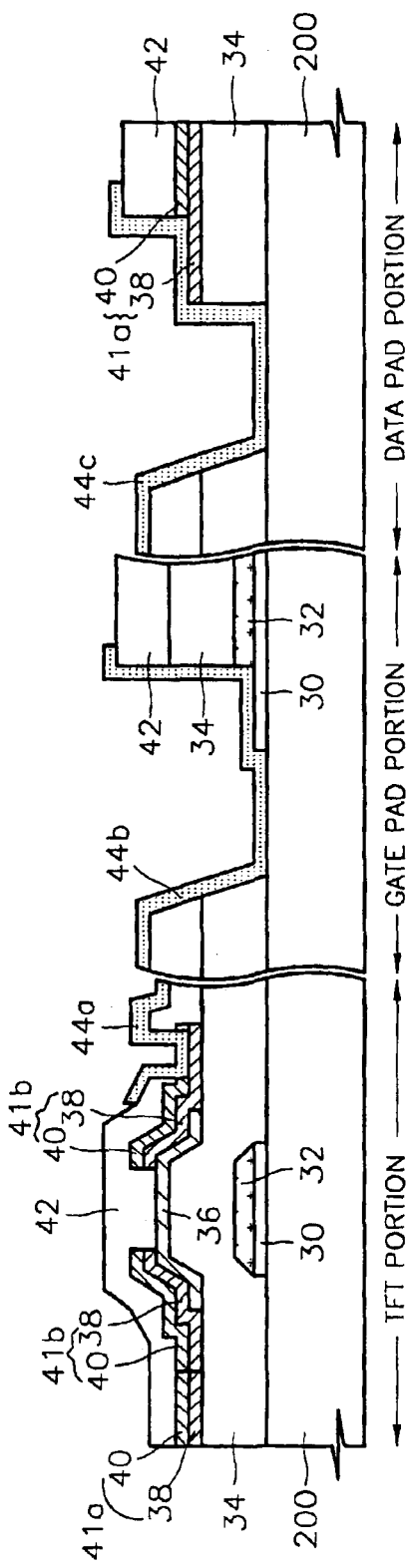

Referring now to FIG. 14 and step 205 of FIG. 9, a blanket transparent conductive layer (e.g., indium-tin-oxide) is then formed on the entire surface of the structure of FIG. 13 and into the contact holes. The transparent conductive layer is then patterned using a dry etching step to define a pixel electrode 44a, gate pad 44b and data pad 44c. Here, the pixel electrode 44a is formed in ohmic contact with the first metal layer 38 of the drain electrode, the gate pad 44b is formed in ohmic contact with the first gate layer 30 of the gate electrode and the data pad 44c is formed in ohmic contact with the first metal layer 38 of the data line. Moreover, the photolithography process for patterning the transparent conductive layer may be performed using a dry etching method, so that erosion of the Al alloy caused by a wet etchant can be prevented. However, a wet etching method may be used since the refractory metal of the data line 41a and the drain electrode 41b functions as a redundant layer even though the Al alloy which forms the data line 41a and the drain electrode 41b together with the refractory metal is eroded by an etchant for etching the ITO layer.

Figure 15:
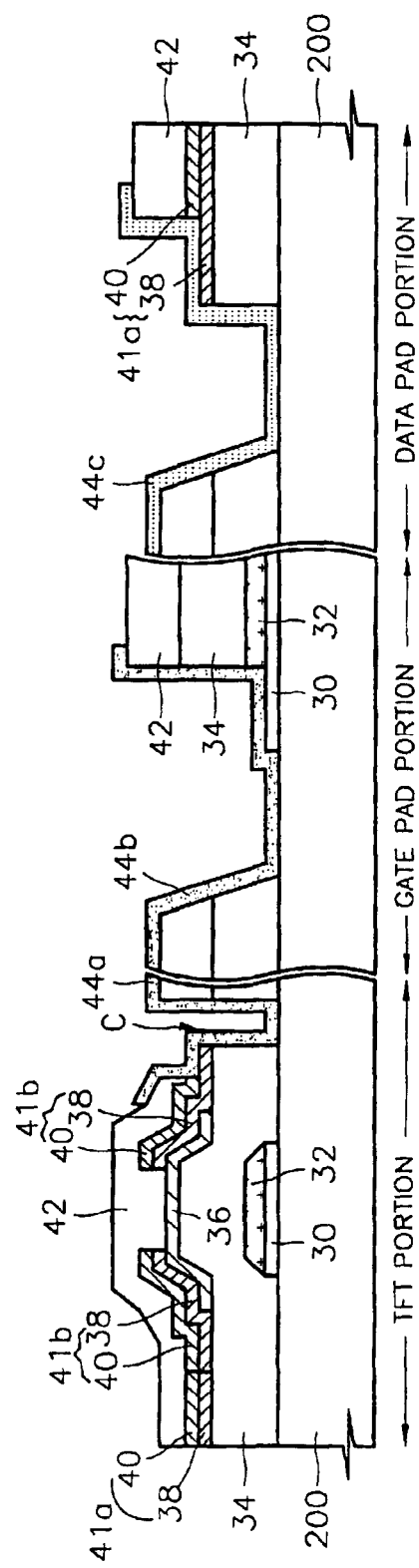
FIG. 15 illustrates a schematic cross-sectional view of a thin-film transistor display device according to a second embodiment of the present invention.

FIG. 15 is a sectional view of a TFT-LCD according to another preferred embodiment of the present invention. Compared to FIG. 6, an opening between the passivation layer 42 and the insulation layer 34 at the drain electrode 41b is wider than that shown in FIG. 6. Accordingly, since the ITO and the Al alloy 40 do not directly contact at the "C" portion, the contact between the pixel electrode 44a and the drain electrode 41b is favorable.

Thus, in the TFT-LCD and the method for manufacturing the same according to the present invention, the data line and the source/drain electrode are formed as a stack of layers made of refractory metal and Al alloy. Thus, good contact resistance between the source/drain electrode and the semiconductor layer pattern can be secured while simultaneously lowering the resistance of the data line. The present invention provides advantages in the manufacturing of large TFT-LCD display devices having highly accurate and fine structures therein. Also, the gate pad and the gate line are connected through contact between the refractory metal and the ITO layer, so that contact resistance can be reduced compared with the conventional TFT-LCD.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A thin film transistor display device, comprising:
   a substrate;
   a gate line on a face of said substrate;
   a first insulating layer having a first contact hole therein that exposes at least a part of side surfaces of said gate line;
   a second insulating layer having a first contact hole therein that exposes at least a part of side surfaces of said gate line;
   a second insulating layer having a second contact hole therein coinciding with said first contact hole of said first insulating layer, so that at least said part of side surfaces of said gate line is exposed; and
   a gate pad on said second insulating layer, said gate pad extending into said first and second contact holes and contacting said part of side surfaces of said gate line.

2. The display device of claim 1, wherein said gate line comprises at least a refractory metal layer.

3. The display device of claim 2, wherein said gate line comprises an underlying refractory metal layer on said substrate and an additional metal layer on said underlying refractory metal layer different from said refractory metal layer.

4. The display device of claim 1, further comprising a data line on said first insulating layer and a data pad on said second insulating layer, said data pad extending into said contact hole and contacting said part of side surfaces of said data lines, wherein said second insulating layer having a third contact hole therein that exposes at least a part of side surfaces of said data line.

5. The display device of claim 1, wherein said gate electrode is getting narrower from the bottom to the top thereof.

6. A thin film transistor display device, comprising:
   a substrate;
   a first insulating layer on said substrate;
   a data line on said first insulating layer;
   a second insulating layer having a contact hole therein that exposes at least a part of side surfaces of said data line; and
   a data pad on said second insulating layer, said data pad extending into said contact hole and contacting said part of side surfaces of said data line.

7. The display device of claim 6, wherein said data line comprises at least a refractory metal layer.

8. The display device of claim 7, wherein said data line comprises an underlying refractory metal layer on said substrate and an additional metal layer on said underlying refractory metal layer different from said refractory metal layer.

9. The display device of claim 1, wherein said first insulating layer comprises another contact hole therein substantially coinciding with said contact hole of said second insulating layer, so that said data pad extends into said another contact hole and contacting said part of side surfaces of said data line.

10. The display device of claim 1, further comprises a gate electrode on said substrate, wherein said gate electrode is getting narrower from the bottom to the top thereof.

* * * * *

UNITED STATES PATENT AND TRADEMARK OFFICE
CERTIFICATE OF CORRECTION

PATENT NO. : 6,878,966 B2  Page 1 of 1
APPLICATION NO. : 10/406668
DATED : April 12, 2005
INVENTOR(S) : Dong-gyu Kim It is certified that error appears in the above-identified patent and that said Letters Patent is hereby corrected as shown below:

On title page Related U.S. Application Data
Item (62)   Change ", which is a continuation of application No. 08/808,866" to -- , which is a divisional of application No. 08/808,866 --.

Column 7
Lines 49-51   Delete the text "a second insulating layer having a first contact hole therein that exposes at least a part of side surfaces of said gate line;"

Column 8
Line 22 Claim 5   Change "electrode" to -- line --..
Line 43 Claim 8   Change "claim 1" to -- claim 6 --.
Line 49 Claim 9   Change "claim 1" to -- claim 6 --.

Signed and Sealed this

Third Day of June, 2008

JON W. DUDAS
*Director of the United States Patent and Trademark Office*